United States Patent [19]

Joseph

[11] 4,453,092

[45] Jun. 5, 1984

[54] COMPARATOR CIRCUIT HAVING REDUCED INPUT BIAS CURRENT

[75] Inventor: Eric D. Joseph, Mesa, Ariz.

[73] Assignee: Motorola, Inc., Schaumburg, Ill.

[21] Appl. No.: 453,380

[22] Filed: Dec. 27, 1982

[51] Int. Cl.³ .................... H03K 5/153; H03K 5/24; H03K 17/72

[52] U.S. Cl. .................................. 307/355; 307/362; 307/252 J; 330/257; 330/288; 340/662; 361/56; 361/91

[58] Field of Search .................. 307/200 A, 350, 354, 307/355, 356, 362, 252 J, 296 R; 340/661, 662; 361/56, 91; 330/257, 288

[56] References Cited

U.S. PATENT DOCUMENTS 3,857,047 12/1974 Knight ............................... 307/362
3,988,595 10/1976 Eatock ............................... 307/355
4,147,944 4/1979 Monticelli ......................... 307/355

Primary Examiner—John Zazworsky
Attorney, Agent, or Firm—Michael D. Bingham

[57] ABSTRACT

A comparator circuit which includes a differential pair of transistors forming differential inputs of the comparator and a voltage level shift circuit coupled in series connection path with the emitters of the pair of transistors. The voltage level shift circuit includes an additional transistor having its collector-emitter path connected in series between an output of the comparator and the emitter of the first pair of transistors; a first diode coupled a series-conduction path to the emitter of the second one of the pair of transistors and having an anode connected to the base of the additional transistor; and a second diode coupled between the base and emitter of the additional transistor wherein the effective beta of the additional transistor is reduced to reduce the bias current that would otherwise flow through the first transistor when such transistor is rendered conductive by an applied differential input signal.

5 Claims, 3 Drawing Figures 4,453,092

COMPARATOR CIRCUIT HAVING REDUCED INPUT BIAS CURRENT

BACKGROUND OF THE INVENTION

This invention relates to precision comparator circuits which may be driven from a single power supply having inputs common moded to a ground reference potential and, more particularly, to integrated comparator circuits that include level shifting circuits coupled between the inputs and output thereof and circuit means for reducing the bias currents appearing at an input thereof.

Differential comparator circuits which are suited for manufacture in monolithic integrated circuit form are well known in the prior art. One such type of comparator circuit comprises a pair of PNP transistors the bases of which are the differential inputs thereof. The collectors of the PNP transistors may be connected to ground reference to provide good noise immunity. In this type of structure, a voltage level shift circuit is required to be coupled between the emitters of the PNP transistors and the output of the comparator in order to provide sufficient input voltage output swing. Typically, the voltage level shift circuit includes a diode connected NPN transistor connected in a series-conduction path to the emitter of one of the PNP transistors and a NPN transistor having its collector-emitter connected in a series-conduction path to the emitter of the second one of PNP transistors and to an output of the comparator circuit. The base of the NPN transistor is connected to the interconnected base and collector of the diode connected transistor.

The above described comparator circuit produces an undersirable current flow out of the input of the comparator connected to the second PNP transistor whenever the differential voltage applied across the inputs of the comparator circuit is such to cause the second PNP transistor to be rendered conductive. This current flow is undesirable because it flows directly to the driving source connected to the base of the second PNP transistor through the source impedance producing an IR voltage drop thereacross which is often undesirable.

Thus, there exists a need for providing a means for reducing the bias current flowing in the input of a precision comparator of the type described above.

SUMMARY OF THE INVENTION

Accordingly, it is an object of the present invention to provide an improved comparator.

Still another object of the present invention is to provide a comparator circuit having reduced bias currents.

Another object of the present invention is to provide a integrated comparator circuit having reduced bias current.

Still another object of the present invention is to provide a circuit and method for a comparator circuit for reducing the bias current thereof.

In accordance with the above and other objects there is provided a comparator circuit comprising first and second conductors; first and second transistors of first conductivity type, each having first and second main electrodes and a control electrode, the second main electrodes being coupled to said to the first conductor, and the control electrodes being the first and second inputs respectively of the comparator circuit; current source means coupled between the second conductor at which is supplied an operating potential for producing current flow at first and second terminals thereof; circuit means for coupling the second terminal of the current source means to an output of the comparator circuit; and level shift circuit means coupled between the first main electrodes of the first and second transistors and the first and second terminals of the current source means which produces a voltage level shift therebetween and includes a third transistor of a second conductivity type having first and second main electrodes and a control electrode, the first and second main electrodes of the third transistor being coupled between the first main electrode of the second transistor and the second terminal of the current source means respectively, the control electrode being coupled to the first terminal and first diode means coupled between the control electrode and the first main electrode of the third transistor.

DETAILED DESCRIPTION OF THE DRAWINGS

DETAILED DESCRIPTION OF THE PREFERRED EMBODIMENT

Figure 1:
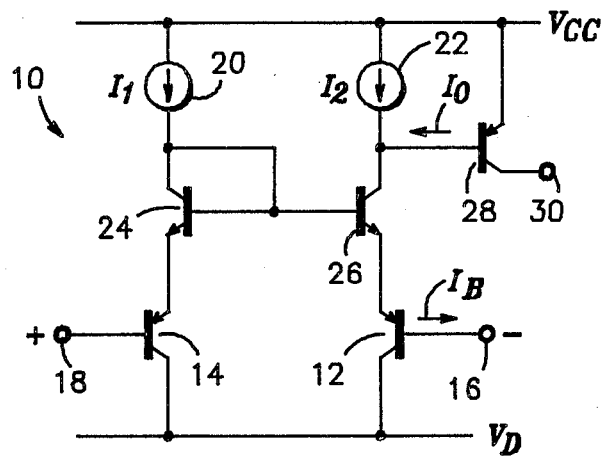
FIG. 1 is a schematic illustrating a comparator of the type of the present invention.

Turning to FIG. 1 there is shown comparator 10 which includes PNP transistors 12 and 14 having respective base electrodes coupled to the inverting and noninverting inputs 16 and 18 of comparator 10. The collectors of transistors 12 and 14 are directly coupled or common moded to conductor $V_D$ which may, as one example, be at ground reference such that the differential input signal that is applied across inputs 16 and 18 may be common moded to ground.

Current source means comprising current sources 20 and 22 is provided which is coupled between a second conductor at which may be supplied the operating potential $V_{cc}$ and includes first and second terminals. A voltage level shift circuit including diode connected transistor 24 and NPN transistor 26 is coupled between the first and second terminals, i.e., current sources 20 and 22, to the respective emitters of transistors 14 and 12. It is understood that comparator 10 may be replaced with complementary components wherein PNP transistors 12 and 14 become NPN devices and NPN transistors 24 and 26 become PNP devices. For example, the MC1741 comparator, manufactured by Motorola, Inc., illustrates such an "inverted" circuit.

The collector of transistor 26 is coupled at a second terminal (the output of current source 22) to the output of comparator 10 which in the referenced circuit is connected to the base of the PNP current sourcing transistor 28. Transistor 28 when rendered conductive sources current at output drive node 30 to a load (not shown).

In typical operation, transistor 28 is rendered conductive whenever the magnitude of the signal applied to the inverting input 16 is less than the magnitude of the signal appearing at the non-inverting input 18 (relative to ground). In this state, transistor 12 is turned on which causes a current $I_B$ to be sourced to the driving source that is coupled to input 16. Hence, transistor 26 is also turned on while transistors 14 and 24 are rendered nonconductive. As the signal at terminal 16 becomes greater than the magnitude of the voltage appearing at terminal 18, comparator 10 switches states wherein transistors 12, 26 and 28 are then shut off and transistors 14 and 24 are rendered conductive.

An undesirable condition arises whenever comparator 10 is operated in the former state, i.e., when the inverting input is pulled low with respect to the non-inverting input. In this state, a large current may flow from the inverting input. The current $I_B$ is substantially equal to the value of:

$$I_B \text{ II } \beta 26/\beta 12 \qquad (1)$$

Where
$\beta 26$ is the beat of transistor 26 and
$\beta 12$ is the beta of transistor 12.

Since the beta of transistor 26 is typically much higher than the beta of transistor 12 at typical current levels, the bias current $I_B$ flowing from the base of transistor 12 into the driving source is significant. This is undesirable because the input of comparator 10 should present an effective high impedance to the driving source. However, the current $I_B$ may produce a significant IR voltage drop in the driving source which in effect reduces the input impedance of the comparator.

Moreover, it can be shown that the magnitude of the current $I_O$ is approximately equal to:

$$I_O \text{ II } \beta 26 \qquad (2)$$

which is also significant. The magnitude of $I_O$ shown above can be undesirable because this current is multiplied by transistor 28 and causes a significant increase in drain current.

Figure 2:
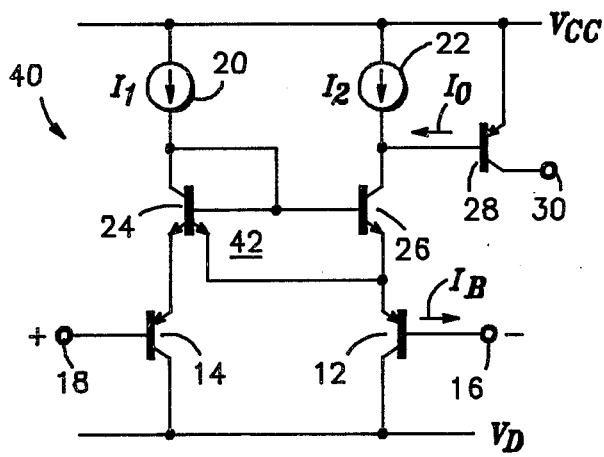
FIG. 2 is a schematic illustrating a comparator circuit of the preferred embodiment of the present invention.

Referring now to FIG. 2 there is shown comparator 40 of the preferred embodiment of the invention which includes circuit means for reducing the bias current flowing at the output of transistor 12. It is to be understood that components of comparator 40 relating to the same components as shown in FIG. 1 are referenced with identical reference numerals. Comparator 40 of the preferred embodiment is illustrated as including an additional diode means 42 formed by fabricating transistor 24 as a multiple-emitter transistor since comparator 40 is in integrated circuit form. It is realized that diode means 42 could be fabricated as a separate diode-connected transistor with the collector and base thereof connected to current source 20 and the emitter coupled to the emitter of transistor 26. However, by utilizing a multiple-emitter transistor space is saved on the die comprising the comparator which is a goal of any integrated circuit designer.

Diode 42 forms a current mirror with transistor 26 which severely reduces the bias current flowing to transistor 12 of comparator 40 by effectively reducing the beta of transistor 26. Thus, it can be shown, for both of the NPN devices being of equal area, the value of $I_B$ is reduced to:

$$I_{B\,I} \text{ 2I1}/\beta 12 \qquad (3)$$

and $I_O$ is reduced to:

$$I_O \text{ II } -I2 \qquad (4)$$

Figure 3:
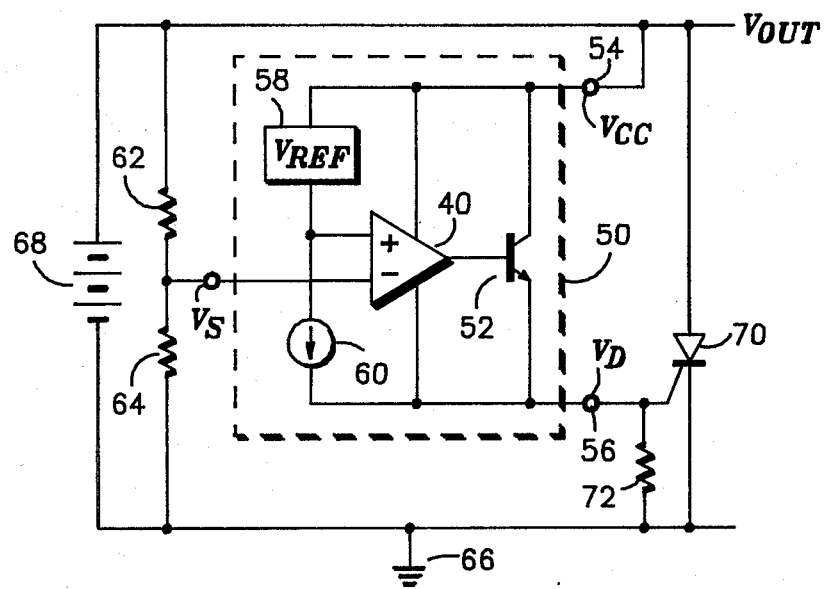
FIG. 3 is a partial schematic and block diagram of an over-voltage protection circuit utilizing the comparator circuit of the present invention.

Referring now to FIG. 3, without intending to limit the scope of the present invention, there is shown a simple three terminal over-voltage sensing circuit which utilizes comparator 40 of the preferred embodiment. As indicated by being drawn within the dashed-in box, those components in combination with comparator 40 are suited to be manufactured in monolithic integrated form.

The output of comparator 40 drives power device 52 which has its collector-emitter path coupled between the two conductors $V_{CC}$ and $V_D$ to external terminals 54 and 56 of sensing circuit 50. A shunt voltage reference 58 and its current drive source 60 are connected between conductors $V_{CC}$ and $V_D$ to the non-inverting input of comparator 40. Hence, the voltage at the non-inverting input is equal to $V_{CC}$-$V_{REF}$. The inverting input of comparator 40 is connected to sense terminal $V_S$ to the inner-connection of a resistor divider circuit comprising resistor 62 and 64 which are series connected between conductors $V_{CC}$ and ground reference 66. Power supply 68 is coupled between $V_{OUT}$ and ground. External terminal $V_D/56$ is coupled to the gate of a "crowbar" SCR 70 which has its anode and cathode connected between the two conductors $V_{OUT}$ and ground respectively. Gate shunt is provided through resistor 72.

In operation, over-voltage protection is provided by the circuit of FIG. 3, for example, to protect sensitive electronic circuitry that may be connected between $V_{OUT}$ and ground reference conductor 66 from an over-voltage condition. Thus, for a given value of resistors 62 and 64, the output state of comparator 10 is a function of the voltage $V_{CC}$. By proper choice of resistors 62 and 64 a predetermined voltage level can be set. As the value of $V_{CC}$ exceeds this voltage level the output state of comparator 40 switches to render transistor 52, (which may be coupled to the collector of transistor 28) conductive to supply current drive to the gate of SCR70. This turns on SCR70 to quickly "crowbar" or short circuit the supply voltage to ground.

I claim:
1. Comparator circuit, comprising:
first and second conductors;
first and second transistors of a first conductivity type, each having first and second main electrodes and a control electrode, said second main electrodes being coupled to said first conductor, said control electrodes being respectively coupled to first and second inputs of the comparator circuit;
current source means coupled to said second conductor at which is supplied an operating potential for producing current flow at first and second terminals thereof;
circuit means for coupling said second terminal of said current source means to an output of the comparator; and
level shift circuit means coupled between said first main electrodes of said first and second transistors and said first and second terminals of said current source means for producing a voltage level shift therebetween which includes a third transistor of a second conductivity type having first and second main electrodes and a control electrode, said first and second main electrodes being coupled between said first main electrode of said second transistor and said second terminal of said current source means, said control electrode being coupled to said first terminal, first diode means coupled between said control electrode and said first main electrode of said third transistor.

2. The comparator of claim 1 wherein said level shift circuit includes second diode means coupled between said first terminal of said current source means and said first main electrode of said first transistor.

3. The comparator of claim 2 wherein said first and second diode means is formed by a single transistor of said second conductivity type having a collector, first and second emitters and a base, said collector and base being interconnected to said first terminal of said current source means, said first emitter being connected to said first main electrode of said first transistor and said second emitter being connected to said first main electrode of said second transistor.

4. A monolithic integrated comparator circuit, comprising:
first and second transistors each having a base, an emitter, and a collector, said bases being coupled respectively to first and second inputs of the comparator, said collectors being coupled to a first conductor;
current source means coupled to a second conductor at which is supplied a source of operating potential for producing current flow at first and second terminals thereof;
circuit means coupled between said first and second terminals of said current source means and said emitters of said first and second transistors for producing a voltage level shift therebetween, said circuit means including a third transistor having a base, an emitter, and a collector, said emitter being coupled to said emitter of said second transistor, said collector being coupled to said second terminal of said current source means and to an output of the comparator circuit and a fourth transistor having a base, a collector, first and second emitters, said base and collector being innerconnected to said first terminal of said current source means and said base of said third transistor, said first emitter being coupled to said emitter of said first transistor, said second emitter being coupled to said emitter of said third transistor.

5. An over-voltage protection circuit comprising the comparator circuit of claim 4 and further including:
voltage reference means coupled between said first and second conductors and having an output coupled to said first input of the comparator circuit for providing a voltage at said first input that is proportional to the value of said operating potential minus a predetermined fixed value;
current drive source means having a control electrode coupled to said output of the comparator and being coupled between said first and second conductors for sourcing current to said first conductor when biased conductive by the comparator circuit being in a first state, said current drive source means being rendered non-conductive whenever the comparator is in a second state;
sense voltage circuit means coupled between said second conductor and a third conductor to which is supplied a ground reference potential, said sense voltage supply circuit means being coupled to said second input of the comparator for supplying a voltage thereto the magnitude of which is compared to the voltage applied at said first input of the comparator wherein the comparator is caused to be in said first state whenever the voltage level appearing at said first input thereof exceeds a voltage level appearing at said second input thereof; and
semiconductor switch means coupled to said first conductor between said second and third conductors which is rendered conductive by said current source from said current drive source means for electrically shorting said second and third conductors.

* * * * *

UNITED STATES PATENT AND TRADEMARK OFFICE
CERTIFICATE OF CORRECTION

PATENT NO. : 4,453,092
DATED : June 5, 1984
INVENTOR(S) : Eric D. Joseph

It is certified that error appears in the above-identified patent and that said Letters Patent is hereby corrected as shown below:

Column 6, claim 5, line 17; after "voltage" insert
--supply--.

Signed and Sealed this

Second Day of April 1985

[SEAL]

*Attest:*

DONALD J. QUIGG

*Attesting Officer*       *Acting Commissioner of Patents and Trademarks*